(12) United States Patent
McCallister (10) Patent No.: US 9,979,359 B2
(45) Date of Patent: *May 22, 2018

(54) MINIMIZING IMPEDENCE MISMATCH EFFECTS IN A WIRELESS DEVICE

(71) Applicant: CrestCom, Inc., Scottsdale, AZ (US)

(72) Inventor: Ronald Duane McCallister, Scottsdale, AZ (US)

(73) Assignee: CCIP, LLC, Scottsdale, AZ (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/642,647

(22) Filed: Jul. 6, 2017

(65) Prior Publication Data
US 2017/0366144 A1    Dec. 21, 2017

Related U.S. Application Data

(63) Continuation of application No. 15/184,823, filed on Jun. 16, 2016, now Pat. No. 9,735,743.

(51) Int. Cl.
*H04B 7/00* (2006.01)
*H03F 1/56* (2006.01)
(Continued)

(52) U.S. Cl.
CPC ............ *H03F 1/56* (2013.01); *H03F 1/0222* (2013.01); *H03F 3/245* (2013.01); *H04W 52/04* (2013.01);
(Continued)

(58) Field of Classification Search
USPC .................................. 455/522, 69–70, 127.1
See application file for complete search history.

(56) References Cited

U.S. PATENT DOCUMENTS

| 5,778,308 | A | 7/1998 | Sroka et al. |
| 7,113,033 | B2 * | 9/2006 | Barnett ................. H03H 11/30 330/129 |

(Continued)

OTHER PUBLICATIONS

Saleh et al., "Improving the Power-Added Efficiency of FET Amplifiers Operating with Varying-Envelope Signals", IEEE Transactions on Microwave Theory and Techniques, Jan. 1993, pp. 51-56, vol. 31, No. 1., NJ USA.

(Continued)

*Primary Examiner* — Fayyaz Alam
(74) *Attorney, Agent, or Firm* — Schmeiser, Olsen & Watts LLP (57) ABSTRACT

Optimized impedance characteristics of a variable impedance device causes the apparatus to transmit wireless signals with minimal out-of-band transmission at an optimized efficiency of the power amplifier. The variation of impedance characteristics of an antenna cause a change in the coefficients of a mapping function. The relatively fast variations to the power supply voltage of a power amplifier are applied to the mapping function to generate control signals which vary the impedance characteristics of a variable impedance device. The output of the mapping function includes control signals that control optimized impedance characteristics of a variable impedance device as a function of the variation of the supply voltage to a power amplifier. The coefficients of the mapping function may be regularly determined based on a comparison of out-of-band power and in-band power transmitted by an antenna.

35 Claims, 7 Drawing Sheets

(51) Int. Cl.
*H03F 3/24* (2006.01)
*H04W 52/04* (2009.01)
*H03F 1/02* (2006.01)
*H04B 1/04* (2006.01)

(52) U.S. Cl.
CPC .................. *H03F 2200/423* (2013.01); *H04B 2001/0408* (2013.01)

(56) References Cited

U.S. PATENT DOCUMENTS

| | | | |
|---|---|---|---|
| 7,570,931 | B2 | 8/2009 | McCallister et al. |
| 8,605,814 | B2 | 12/2013 | McCallister et al. |
| 8,872,720 | B2 | 10/2014 | Bae |
| 8,948,713 | B2 | 2/2015 | Kratochwil et al. |
| 9,130,543 | B2 | 9/2015 | McKinzie |
| 9,184,722 | B2 | 11/2015 | Bakalski |
| 2003/0141927 | A1* | 7/2003 | Barnett .................. H03H 11/30 330/129 |
| 2004/0198271 | A1 | 10/2004 | Kang |
| 2005/0059362 | A1 | 3/2005 | Kalajo et al. |
| 2014/0313088 | A1 | 10/2014 | Rozenblit et al. |
| 2015/0094008 | A1* | 4/2015 | Maxim ............... H01F 17/0013 455/245.1 |
| 2015/0120219 | A1 | 4/2015 | Merlin et al. |

OTHER PUBLICATIONS

Carusone et al., "Analog Filter Adaptation Using a Dithered Linear Search Algorithm", Int'l Symp. Circuits Systems, ISCAS 2002, vol. 4, 2002, pp. 269-272.

Greenemeier, "People Love Their Smartphones but Hate the Batteries [Survey Results]", Scientific American, Nov. 28, 2014, pp. 1-6.

Hendy et al., "Envelope Tacking for RF Power Amplifiers in Mobile Handsets", Tech Design Forum, Mar. 7, 2012, pp. 1-4, http://www.techdesignforums.com/practice/technique/envelope-tracking-for-rf-power-amplifier.

Issei Kanno, Yoshiaki Amano, and Akira Yamaguchi, Experimental Evaluation of Adaptive Impedance Control for MIMO Antennas in an FDD-LTE Terminal, 2013, pp. 373-375, KDDI R&D Laboratories Inc., Feb. 1, 2015 Ohara, Fujimino City, Saitama, 356-8502 Japan.

* cited by examiner

MINIMIZING IMPEDENCE MISMATCH EFFECTS IN A WIRELESS DEVICE

CROSS REFERENCE TO RELATED APPLICATION(S)

This U.S. patent application claims priority to U.S. patent application Ser. No. 15/184,823, which was filed on Jun. 16, 2016 and is hereby incorporated by reference herein in its entirety.

BACKGROUND

In the field of wireless communications, a frequency spectrum may be a valuable property right. Frequency spectrums are often licensed to cellular telephone service providers, allowing them to provide wireless service to millions of customers using their equipment network. To maximize revenue from data traffic operating within their licensed frequency spectrum, cellular telephone service providers must densely pack user channels into their licensed frequency spectrum. Potential interference with adjacent channel traffic severely constrains the amount of radio-frequency energy which may be transmitted outside any assigned spectral channel. Cellular telephone equipment often cannot be approved for sale by government regulators unless its transmissions satisfy strict constraints on out-of-band transmitted energy.

Wireless transmitters must use power amplifiers to increase the power of the transmitted signal so that sufficient power is received at the other end of the data link. Power amplifier operation reflects a compromise between the efficiency with which battery power is converted into useful signal power and the degree of to which transmitted energy appears outside the assigned spectral channel. Power amplifiers often operate relatively inefficiently in order to satisfy regulatory constraints on out-of-band energy.

Two related art technologies in transmission technology attempt to address the tradeoff between efficiency and out-of-band energy. In one related art technology, envelope Tracking (ET) dynamically varies the level of the amplifier's power supply voltage, so it is always at the minimum level demanded for linear amplifier operation. However, this dynamic supply voltage causes the amplifier output impedance to also dynamically vary, inducing undesirable mismatch between the amplifier and subsequent transmitter components. A second related art technology dynamically varies output impedance of a device between a power amplifier and an antenna, attempting to minimize mismatches caused by antenna input impedance variations induced by objects moving in close proximity to the cellphone antenna. Any variation in impedance may result in a dynamic mismatch between the output impedance of one component and the input impedance of the next component. Mismatches may cause energy to be reflected and energy reflected back into the nonlinear amplifier increases out-of-band energy levels. The need exists for a method and/or apparatus to minimize out-of-band energy caused by dynamic impedance mismatches associated with either ET or techniques compensating for antenna input impedance variations due to proximate objects.

SUMMARY

Mobile devices (e.g. cellular phones, smart phones, tablets, laptops, etc.) may have a finite battery life. Embodiments relate to a wireless transmission system that optimizes critical power consumption of a power amplifier in a mobile device or other device. In embodiments, a power amplifier in a mobile device may receive a transmission signal within a licensed frequency spectrum. The power amplifier may have a variable voltage supply and may be coupled to an antenna through a variable impedance device. Impedance characteristics of a variable impedance device may be optimized based on variations of impedance characteristics of an antenna, such that a power amplifier operates at an optimized power consumption.

In embodiments, optimized impedance characteristics of a variable impedance device may cause transmission of wireless signals with minimal out-of-band transmission at an optimized efficiency of a power amplifier. The variation of impedance characteristics of an antenna may cause a change in the coefficients of a mapping function. The relatively fast variations to a power supply voltage of a power amplifier may be applied to a mapping function to generate control signals which vary impedance characteristics of a variable impedance device. The output of the mapping function comprises at least one control signal that controls the optimized impedance characteristics of a variable impedance device as a function of the variation of the supply voltage to a power amplifier. The coefficients of a mapping function are regularly determined based on a comparison of out-of-band power and in-band power transmitted by an antenna. Since the changes of the coefficients of a mapping function change less frequently than the variation of a power supply voltage to a power amplifier, optimized coefficients of a mapping function may be dynamically determined by an orthogonal dither (or other means) to optimize power consumption in a mobile device.

Some changes in impedance mismatch are due to the environment of an antenna. For example, if a mobile device operates while sitting on a metal table, the metal table will cause a change in the input impedance of the antenna compared to if the mobile device is placed next to a user's ear. A change of input impedance of the antenna may cause signals to be reflected back into the power amplifier in a manner that causes undesirable out-of-band transmissions (e.g. due to intermodulation). In embodiments, the coefficients of a mapping function may be dynamically calculated to optimize power consumption and out-of-band transmission tradeoffs in a mobile device.

DRAWINGS

Example

Example

Example

Example

Example

Example

Example

Example

Example

Example

DESCRIPTION

Figure 1:
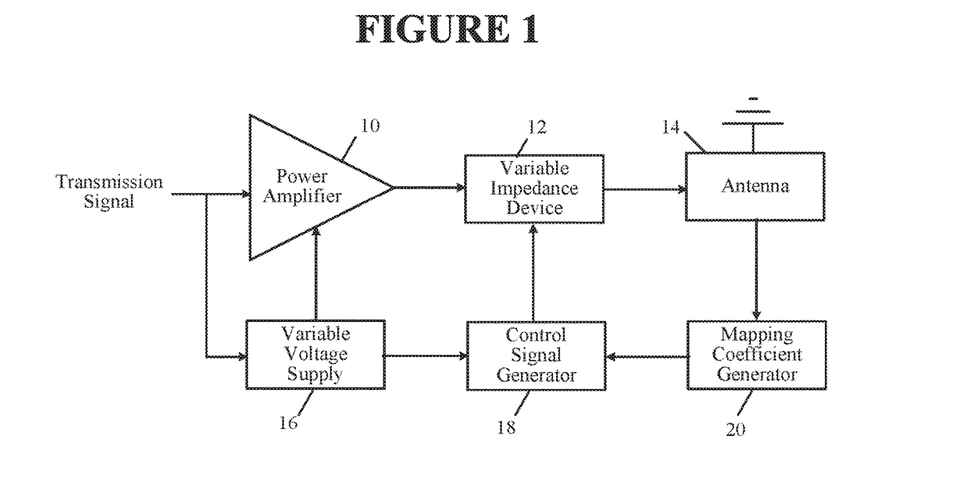
FIG. 1 illustrates control of a variable impedance device in a wireless transmission system, in accordance with embodiments.

Example FIG. 1 illustrates an apparatus, in accordance with embodiments. The apparatus may be a battery operated apparatus, such as a mobile device, cellular telephone, smart phone, tablet computer, laptop computer or other battery operated device. Alternatively the apparatus may be a stationary device that operates without a battery power source (e.g. a base station). Embodiments relate to a wireless transmission systems which may be included or work cooperatively with cellular telephones, base stations, repeaters, or other wireless devices.

The apparatus illustrated in FIG. 1 may include a power amplifier 10, variable impedance device 12, and antenna 14, in accordance with embodiments. Variable impedance device 12 may be electrically coupled to an output of power amplifier 10. Antenna 14 may be coupled to an output of variable impedance device 12. The at least one antenna or antenna system 14 may be either a single antenna or multiple antennas operating as an array or other configuration, hereinafter referred to as antenna 14. The at least one variable impedance device 14 may be either a single device/component or a network of devices/components or other configuration, hereinafter referred to as variable impedance device 12. Power amplifier 10 may be either a single device/component or a network of devices/components or other configuration, hereinafter referred to as power amplifier 10.

A transmission signal may originate as a relatively low power signal and then be subsequently amplified to a more powerful electrical signal. This amplification may be necessary or desirable to increase or optimize the range of wireless devices. Aspects of embodiments can have applications outside of wireless communications.

In embodiments, variable impedance device 12 dynamically varies input impedance as seen by power amplifier 10. In embodiments, variable impedance device 12 dynamically varies output impedance as seen by antenna 14. In embodiments, variable impedance device 12 dynamically varies input impedance as seen by power amplifier 10 and dynamically varies output impedance as seen by antenna 14. The combination of the input impedance as seen by power amplifier 10 and the output impedance as seen by antenna 14 are optimized impedance characteristics of variable impedance device 12.

In order to optimize the efficiency of power amplifier 10 and/or optimize the average transmitted power from antenna 14, an envelope tracking method may be implemented. Envelope tracking (or similar method) may dynamically vary the voltage supplied to power amplifier 10 depending on the characteristics of the transmission signal input into power amplifier 10. Variable voltage supply 16 may receive a transmission signal and based on a substantially instantaneous evaluation of the transmission signal may dynamically vary the voltage supplied to power amplifier 10 to optimize the instantaneous performance of power amplifier 10.

A transmission signal amplified by power amplifier 10 and propagated by antenna 14 may have random magnitude variations, reflecting the random nature of the information imposed on the modulating waveform of the input transmission signal. In envelope tracking, the average efficiency of power amplifier 10 may be optimized by instantaneously varying the voltage supplied to power amplifier 10 such that the peak radio frequency signal magnitude is always slightly less than the magnitude of voltage supplied by variable voltage supply 16. Since the average efficiency of power amplifier 10 decreases with larger supply voltages, envelope tracking minimizes the average voltage supplied to power amplifier 10.

As an example, variable voltage supply 16 is illustrated in FIG. 1 that receives a transmission signal. Based on the changes in the instantaneous peak radio frequency magnitude of the input transmission signal, variable voltage supply 16 supplies a varying supply voltage to power amplifier 10 that optimizes the efficiency of power amplifier 10. This variation of the supply voltage to power amplifier 10 may be referred to as envelope tracking or may be a similar method. Although variable supply voltage 16 is illustrated as a single block for simplification, variable supply voltage 16 may be any combination of components that vary the supply voltage of power amplifier 10 based on characteristics of a transmission signal input into power amplifier 16.

Power amplifier 10 has impedance characteristics that should be matched with antenna 14 in order for antenna 14 to most efficiently propagate a wireless signal. When the voltage supply to power amplifier 10 is rapidly varied in normal operation, the output impedance characteristics of power amplifier 10 also vary, resulting in mismatches between the output impedance of power amplifier 10 and antenna 14. To compensate of these impedance mismatches, variable impedance device 12 may be disposed in between power amplifier 10 and antenna 14. Variable impedance device 12 may rapidly vary and optimize the input impedance of antenna 14 as seen by the power amplifier 10. Variable impedance device 12 may be responsive to the instantaneous changes in the voltage supplied to power amplifier 10 to optimize in substantially real time the impedance matching between power amplifier 10 and antenna 14.

Figure 2:
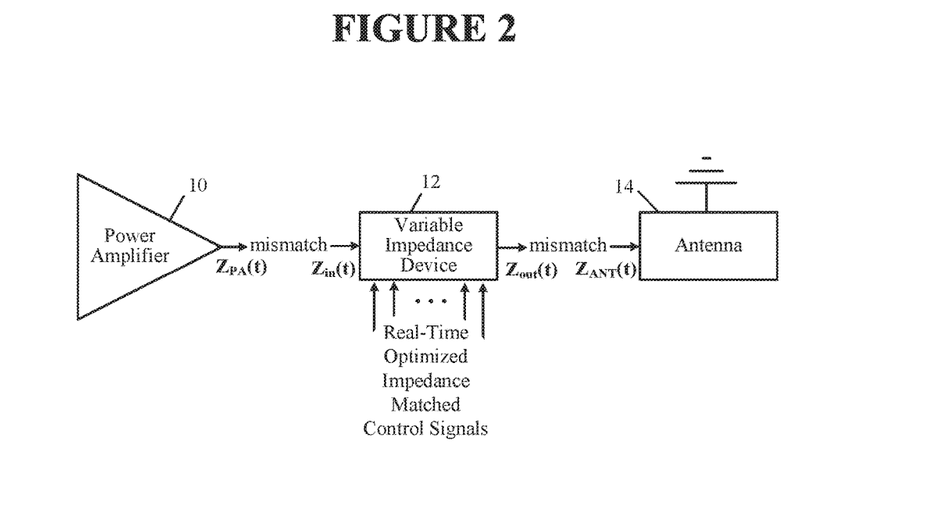
FIG. 2 illustrates impedance mismatch balance between a power amplifier, variable impedance device, and antenna, in accordance with embodiments.

As illustrated in example FIG. 2, real-time optimized impedance matched control signals may control variable impedance device 12 such that at any given time, the output impedance (ZPA(t)) of power amplifier 10 is matched with the input impedance (ZANT(t)) of antenna 14, in accordance with embodiments. The real-time optimized impedance matched control signals may control the input impedance (Zin(t)) of variable impedance device 12 as seen by power amplifier 10. The real-time impedance matched control signals may control the output impedance (Zout(t)) of variable impedance device 12 as seen by antenna 14. The output impedance (ZPA(t)) of power amplifier 10 (as seen by variable impedance device 12) may vary relatively fast based on the relatively fast variations of the voltage supplied to power amplifier 10. The input impedance (ZANT(t)) of antenna 14 (as seen by variable impedance device 12) may vary relatively slow based on changes in the physical environment surrounding antenna 14 or for other reasons. The input impedance (ZANT(t)) of antenna 14 and output impedance (ZPA(t)) of power amplifier 10 may be independent from each other. At any given instant, real-time optimized impedance matched control signals may be selected that optimally balance the relatively fast changes in the output impedance (ZPA(t)) of power amplifier 10 and the relatively slow changes in the input impedance (ZANT(t)) of antenna 14, in accordance with embodiments.

In embodiments, variable impedance device 12 is controlled by control signal generator 18. Control signal generator 18 sends control signals in substantially real time to vary the input impedance (Zin(t)) of variable impedance device 12 to match the relatively fast varying output impedance (ZPA(t)) of power amplifier 10. Control signal generator 18 may send control signals in substantially real time to vary the output impedance (Zout(t)) of variable impedance device 12 to match the relatively slow varying input impedance (ZANT(t)) of antenna 14. At any given instant, there is an optimized input impedance (Zin(t)) and output impedance (Zout(t)) of variable impedance device 12 that allows for the most efficient power consumption and performance characteristics of power amplifier 10. Although the optimized input impedance (Zin(t)) and output impedance (Zout(t)) of variable impedance device 12 may be optimal from a power consumption perspective and/or a performance perspective, there may be some impedance mismatch between power amplifier 10, variable impedance device 12, and/or antenna 14.

As illustrated in example FIG. 1, control signal generator 18 controls variable impedance device 12 based on feedback from power amplifier 10 and feedback from antenna 14, in accordance with embodiments. In embodiments, mapping coefficient generator 20 may receive feedback from antenna 14 that causes the generation of mapping coefficients. The mapping coefficient may be used to determine the variables of a mapping function, to which the relatively fast variation of supply voltage to the power amplifier 10 may be applied to generate real-time optimized impedance matched control signals to variable impedance device 12.

The output impedance (ZPA(t)) of power amplifier 10 varies at a faster rate than changes in the input impedance (ZANT(t)) of antenna 14. Variable impedance device 12 must react relatively quickly to changes in the output impedance (ZPA(t)) of power amplifier 10 since the output impedance (ZPA(t)) of power amplifier 10 varies at a relatively fast rate. In embodiments, variable impedance device 12 may react relatively slowly to the changes in the input impedance (ZANT(t)) of antenna 14, since the input impedance (ZANT(t)) of antenna 14 changes at a relatively slow rate compared to the rate of change in the output impedance (ZPA(t)) of power amplifier 10. In embodiments, the relatively slow variations in the input impedance (ZANT(t)) of antenna 14 may cause relatively slow changes to the mapping coefficients provided to control signal generator 18. In embodiments, the relatively fast variations in the output impedance (ZPA(t)) of power amplifier 10 may be quickly mapped to a mathematical function of control signal generator 18 that controls the instantaneous characteristics of variable impedance device 12.

As the environmental circumstances of the wireless device gradually change, the input impedance of antenna 14 also gradually change, therefore causing a need to gradually change the parameters of the mathematical function of control generator 18. For example, the environmental circumstances of a wireless device may be a mobile telephone initially placed on a metal table and then upon receiving a telephone call a user may change the physical location of the mobile phone from the metal table to the user's ear. Due to the physics of antennas, antenna 14 will have a different input impedance (ZANT(t)) when it is placed on a metal table compared to when it is being held up to a user's ear. However, this change in the input impedance (ZANT(t)) of antenna 14 is relatively slow compared to the relatively fast changes in the output impedance (ZPA(t)) of power amplifier 10. If a mapping function of control signal generator 18 does not change in response to changes in the input impedance (ZANT(t)) of antenna 14, then the real-time parameters of the variable impedance device 12 may not be optimized, thus resulting in unnecessarily inefficient operation of power amplifier 10.

For example, an impedance mismatch due to changes in the input impedance (ZANT(t)) of antenna 14 may ultimately cause out-of-band transmissions at the power amplifier 10. In some circumstances, undesirable signals are reflected back into power amplifier 10 from variable impedance device 12 and/or antenna 14 due to impedance mismatches at antenna 14. These reflected undesirable signals may cause power amplifier 10 to transmit out-of-band transmissions, which may be caused by an undesirable harmonic effect in the power amplifier from reflected signals. Optimized impedance matched control signals minimize undesirable harmonic effect by choosing impedance characteristics of variable impedance device 12 that better meet the licensed frequency spectrum requirements (e.g. minimizes out-of-band transmissions) and/or power consumption efficiency of power amplifier 10. An inefficiently running power amplifier 10 may reduce the battery life of a mobile device or cause other degradations in wireless service. A mobile device that transmits unnecessary out-of-band transmissions may be a regulatory or financial burden to its associated cellular telephone service provider.

In embodiments, optimized impedance matched control signals balance performance and efficiency of a wireless device. In embodiments, the optimized impedance characteristics of variable impedance device 12 causes antenna 14 to transmit wireless signals with minimal out-of-band transmission at an optimized efficiency of power amplifier 10. In embodiments, variation of impedance characteristics of antenna 14 may cause a change in coefficients of a mapping function. An output of the mapping function may include at least one control signal that controls the optimized impedance characteristics of variable impedance device 12 as a function of the variation of the supply voltage to power amplifier 10.

Figure 3:
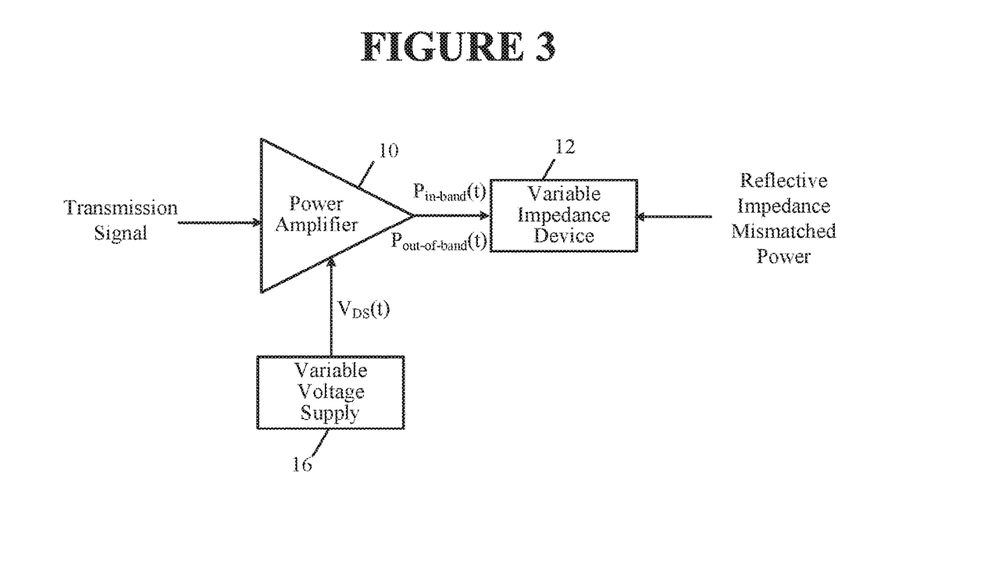
FIG. 3 illustrates minimization of out-of-band power transmission by a power amplifier, in accordance with embodiments.

Example FIG. 3 illustrates minimization of out-of-band power transmission by power amplifier 10, in accordance with embodiments. At any given instant, there may be an impedance mismatch due to changes in the impedance of antenna 14. Such impedance mismatches may cause reflections from antenna 14 back into variable impedance device in the form of reflective impedance mismatched power. Reflected signals may cause intermodulation in power amplifier 10 and/or variable impedance device 12 that cause an undesirable ratio of in-band transmissions Pin-band(t) to out-of-band transmissions Pout-of-band(t). In embodiments, the coefficients of the mapping function are determined based on a comparison of out-of-band power and in-band power transmitted by the at least one antenna 14 and/or generated by power amplifier 10.

Variable supply voltage 16 may vary drain supply voltage VDS(t) according to an envelope tracking method or other means. An undesirable ratio of in-band transmissions Pin-band(t) to out-of-band transmissions Pout-of-band(t) may be at least partially caused by impedance mismatches between power amplifier 10 and variable impedance device 12.

In embodiments, an apparatus is configured to transmit through antenna 14 a wireless signal within a predetermined frequency spectrum. The in-band power transmitted by antenna 14 represents transmission power of the wireless signal within the predetermined frequency spectrum. The out-of-band power transmitted by antenna 14 represents transmission power of the wireless signal outside of the predetermined frequency spectrum.

Figure 4:
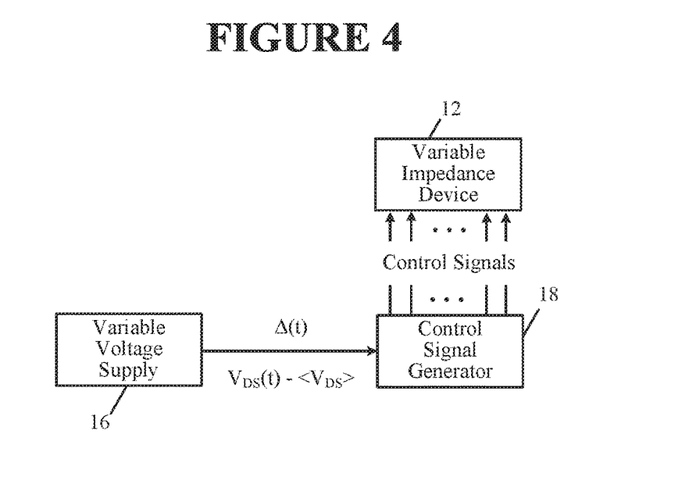
FIG. 4 illustrates control of a variable impedance device based on changes of a variable voltage supply to a power amplifier, in accordance with embodiments.

Example FIG. 4 illustrates control of variable impedance device 12 based on changes of variable voltage supply 16 to a power amplifier 10, in accordance with embodiments. In embodiments, a variable of the mapping function may be an instantaneous difference $\Delta(t)$ between an instantaneous value $VDS(t)$ of the supply voltage to power amplifier 12 and a long-term average of the supply voltage $<(VDS)>$ of power amplifier 12 (e.g. $\Delta(t)=VDS(t)-<(VDS)>$). This instantaneous difference $\Delta(t)$ may be applied as a variable to a mapping function residing in control signal generator 18. Control signal generator 18 may be separated or integrated with variable voltage supply 16 and/or variable impedance device 12, in accordance with embodiments. Variable voltage supply 16 may be any device that supplies a variable voltage to power amplifier 10 and provide direct or indirect feedback to control signal generator 18 for variable impedance device 12.

Control signal generator 18 may generate any number of control signals (including a single control signal) that vary the impedance characteristics of variable impedance device 12 at a relatively quick speed. For example, control signal generator may generate four signals, one for the real component of input impedance, one for the imaginary component of input impedance, one for the real component of output impedance, and one for the imaginary component of output impedance.

Figure 5:
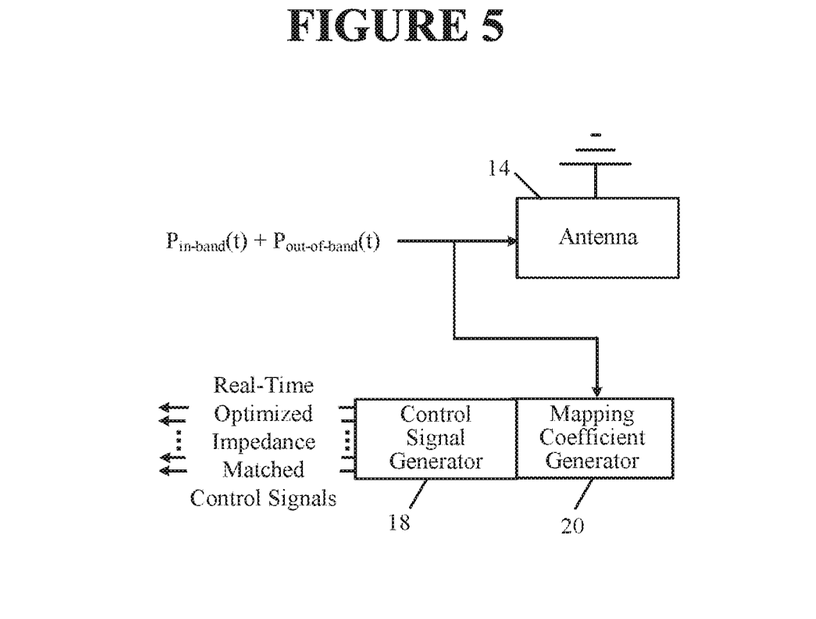
FIG. 5 illustrates generation of real-time optimized impedance matched control signals, in accordance with embodiments.
Figure 6:
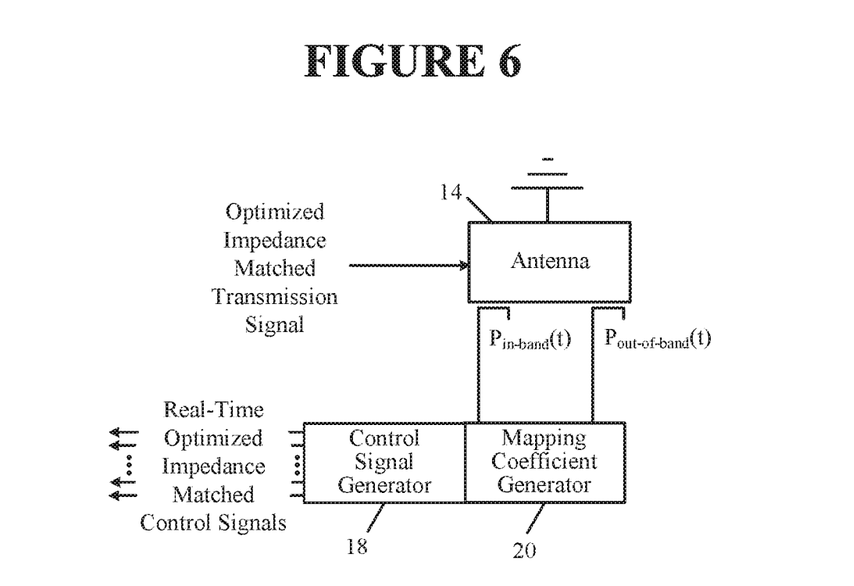
FIG. 6 illustrates an optimized impedance matched transmission signal responsive to real-time optimized impedance matched control signals, in accordance with embodiments.

Example FIGS. 5 and 6 illustrate generation of real-time optimized impedance matched control signals, in accordance with embodiments. In embodiments, the comparison of the out-of-band power and the in-band power transmitted by antenna 14 represents impedance matching characteristics between antenna 14 with variable impedance device 12. In embodiments, the variation of impedance characteristics of antenna 14 is determined by measurement of out-of-band power compared with in-band power transmitted by antenna 14. For example, the measurement of the in-band and out-of-band power may be directly measured from the signal immediately before antenna 14 (e.g. FIG. 5) or otherwise electrically coupled to antenna 14 (e.g. FIG. 6), in accordance with embodiments. The measured in-band power and out-of-band power is compared and based on an algorithm mapping coefficients are generated by mapping coefficient generator 20.

Mapping coefficient generator 20 may be separated or integrated with either antenna 14 and/or control signal generator 18, in accordance with embodiments. Mapping coefficient generator 20 changes the mapping coefficients used by control signal generator 18 at a relatively slow speed compared to the changes in the control signals from control signal generator 18 to variable impedance device 12. Control signal generator 18 must respond relatively quickly to the rapid variance in the voltage supply to power amplifier 10, while mapping coefficient generator 20 responds relatively slowly to increases in out-of-band transmissions Pout-of-band that may be a result of changes in the impedance characteristics of antenna 14 from environmental changes (e.g. moving antenna from a metal table to a user's ear). As the environmental changes occur in antenna 14, mapping coefficient generator 20 may gradually change and optimize mapping coefficients used by control signal generator 18.

In embodiments, the mapping function is represented by a polynomial sequence with the coefficients of the mapping function representing the weighting of the polynomial elements. The polynomial sequence may be a linear combination of orthogonal polynomials. In embodiments, the orthogonal polynomials may be Hermite polynomials. The coefficient of the mapping function may be determined by adaptive loops that vary the coefficients of the mapping function. In embodiments, the adaptive loops apply an orthogonal dither to dynamically determine the coefficients of the mapping function. In embodiments, an orthogonal dither control loop acts to minimize the ratio of out-of-band power (e.g. Pout-of-band(t)) to in-band power (e.g. Pin-band (t)). One of ordinary skill in the art would appreciate implementing an objective function of an orthogonal dither loop, in accordance with embodiments.

Figure 7:
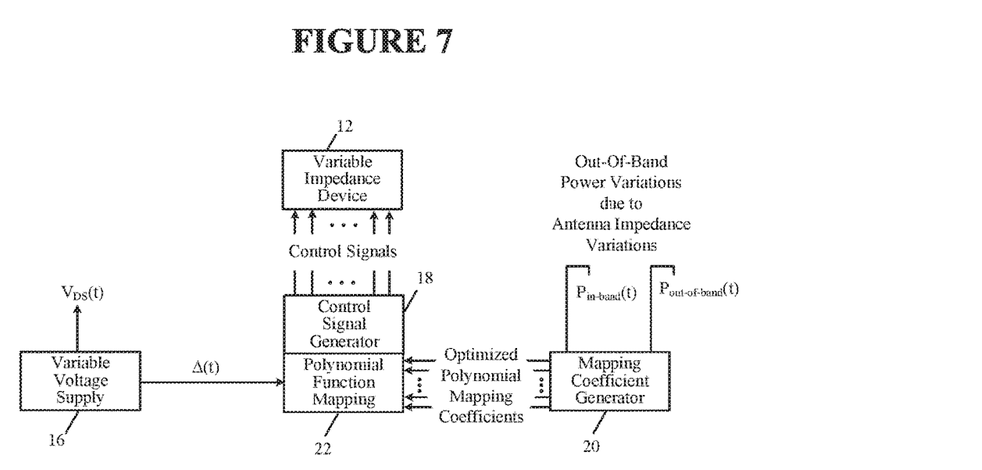
FIG. 7 illustrates mapping a variable voltage supply using optimized mapping coefficients, in accordance with embodiments.

Example FIG. 7 illustrates mapping a variable voltage supply using optimized mapping coefficients, in accordance with embodiments. For example, variable voltage supply 16 may supply varied supply voltage $VDS(t)$ to power amplifier 10. Polynomial function mapping 22 may map a rapidly varying indicator (e.g. $\Delta t$ of $VDS(t)$) so that control signal generator 18 can substantially instantaneously control variable impedance device 12 using control signals. During this rapid mapping, mapping coefficient generator 20 may dynamically measure and compare in-band and out-of-band power variations due to antenna impedance variations to generate optimized polynomial mapping coefficients that are used by control signal generator 18 and/or polynomial function mapping 22. Polynomial function mapping 22 may be an integrated or separated aspect of control signal generator 18, in accordance with embodiments.

Figure 8:
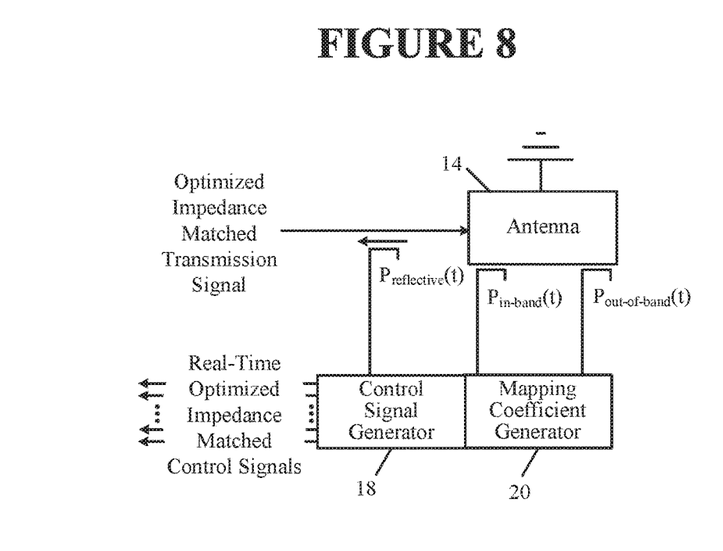
FIG. 8 illustrates use of signals reflected from an antenna with measurements of out-of-band transmissions to determine optimized mapping coefficients, in accordance with embodiments.

Example FIG. 8 illustrates use of signals reflected from antenna 14 with measurements of out-of-band transmissions to determine optimized mapping coefficients, in accordance with embodiments. Signals (e.g. Preflective(t)) that may be reflected from antenna 14 due to impedance mismatches and may be measured/used by control signal generator 18 and/or mapping coefficient generator 20. Although some embodiments may use reflected signals Preflective(t) to generate real-time optimized impedance matched control signals, other embodiments may generate real-time optimized impedance matched control signal without measuring reflected signals Preflective(t).

Figure 9:
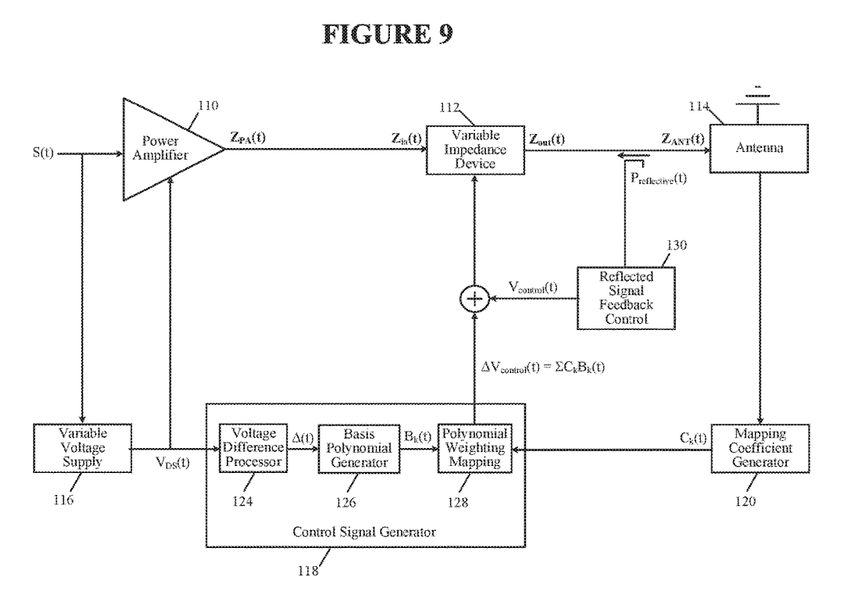
FIG. 9 illustrates polynomial function mapping, in accordance with embodiments.

Example FIG. 9 illustrates polynomial function mapping, in accordance with embodiments. In embodiments, there may be two impedance interfaces (e.g. $Zin(t)$ and $Zout(t)$). The first impedance interface (e.g. $Zin(t)$) may be the input to the variable impedance device as seen by power amplifier 110 having a varying output impedance (e.g. $ZPA(t)$). The second impedance interface (e.g. $Zout(t)$) may be the output of variable impedance device 112 as seen by antenna 114. Both impedance interfaces (e.g. $Zin(t)$ and $Zout(t)$) exhibit both real and imaginary components each of which may be separately controlled by one or more control signals from control signal generator 118 and/or reflected signal feedback control 130, in accordance with embodiments.

In embodiments, between one and four control voltages may be applied as control signals (e.g. Vcontrol(t) and/or $\Delta$Vcontrol(t)) to variable impedance device 112. At any given instantaneous values of $ZPA(t)$ and $ZANT(t)$, there are optimized control signals (e.g. Vcontrol(t) and/or $\Delta$Vcontrol (t)) that optimize the impedance characteristics $Zin(t)$ and $Zout(t)$ of variable impedance device 112 for optimized power efficiency and/or performance of power amplifier 110. In embodiments, control signals Vcontrol(t) and/or $\Delta$Vcontrol(t) may cause variable impedance device 112 to operate at optimized impedance characteristics (e.g. Zin(t) and Zout(t)) which minimize out-of-band transmissions caused by undesirable signal reflections due to the varying impedance mismatching between power amplifier 110 and antenna 114.

Power amplifier 110 supply voltage VDS(t) may independently vary at a relatively high rate (e.g. with a multi-megahertz bandwidth), in accordance with embodiments. For example, an envelope tracked power amplifier 110 may have a supply voltage VDS(t) from variable voltage supply 116 that nominally exceeds the maximum instantaneous radio frequency signal magnitude (which may vary at a relatively high rate) of the source transmission signal S(t) that is being amplified by power amplifier 110. As supply voltage VDS(t) varies at a relatively high rate, the output impedance ZPA(t) of power amplifier 110 also varies at a relatively high rate, since power amplifier 110 will have different impedance characteristics for different values of supply voltage VDS(t). As supply voltage VDS(t) varies at a relatively high rate, the impedance characteristics (e.g. Zin(t) and Zout(t)) of variable impedance device 112 are controlled to change at a corresponding relatively high rate, in accordance with embodiments.

In embodiments, voltage difference processor 124 may convert the variable voltage supply VDS(t) into a more sensitive supply voltage difference value Δ(t), which may be the difference of the instantaneous value of the variable voltage supply VDS(t) and a long term average value of the variable voltage supply <VDS(t)>. Supply voltage difference value Δ(t) may equal the difference between a long term average value of variable voltage supply <VDS(t)> and the substantially instantaneous value of variable voltage supply VDS(t) (e.g. Δ(t)=VDS(t)−<(VDS)>).

Supply voltage difference value Δ(t) may be applied as a relatively fast varying variable to basis polynomial functions in basis polynomial generator 126 to generate one or more basis polynomial values Bk(t), in accordance with embodiments. Basis polynomials functions (e.g. Hermite polynomial functions or other polynomial functions) may be relatively quick to respond to the relatively high rate at which supply voltage VDS(t) varies. Basis polynomial generator 126 may output basis polynomial values Bk(t) to polynomial weighting mapping 128, which assigns weights to each of basis polynomial values Bk(t) calculated at basis polynomial generator 126. Output basis polynomial values Bk(t) may vary at a relatively high rate corresponding to a relatively high rate of variance in variable voltage supply VDS(t).

For example, a third-order polynomial function may be the underlying basis function used by basis polynomial generator 126. One of ordinary skill in the art would appreciate that any order polynomial function (including a zero order polynomial) may serve as an underlying basis function used by polynomial generator 126, in accordance with embodiments. In one example embodiment, the underlying polynomial function of polynomial generator 126 may be simple third order polynomials $\{1, V_{DS}(t), V_{DS}^2(t), V_{DS}^3(t)\}$, such that polynomial generator 126 will output four basis polynomial output values Bk(t) to polynomial weighting mapping 128. A third-order polynomial may be represented by a linear combination of the four components of the basis (e.g. $\{1, V_{DS}(t), V_{DS}^2(t), V_{DS}^3(t)\}$ or $\{1, 2V_{DS}(t), 4V_{DS}^2(t)-2, 8V_{DS}^3(t)-12V_{DS}(t)\}$). In other example embodiments, the underlying polynomial function of polynomial generator 126 may be third order Hermite polynomials $\{1, 2V_{DS}(t), 4V_{DS}^2(t)-2, 8V_{DS}^3(t)-12V_{DS}(t)\}$, such that polynomial generator 126 will rapidly output four basis polynomial values Bk(t) to polynomial weighting mapping 128. Hermite polynomials are one kind of orthogonal polynomials.

Polynomial weighting mapping 128 may receive one or more mapping coefficients Ck(t) from mapping coefficient generator 120 corresponding to output polynomial values Bk(t), in accordance with embodiments. For example, basis polynomial generator 126 outputs four rapidly varying values for Bk(t) corresponding to an underlying third order polynomial function and mapping coefficient generator 120 will output four corresponding mapping coefficients Ck(t) (e.g. ΔVcontrol(t)=ΣCkBk(t)). In embodiments, when rapidly vary Bk(t) is mapped to slower varying Ck(t), polynomial weighting mapping 128 outputs control signals ΔVcontrol(t) to control variable impedance device 112. Control signals ΔVcontrol(t) may vary at a relatively high rate corresponding to the relative high variance in variable voltage supply VDS(t). The mapping coefficients Ck(t) may be varying at a lower rate than the variance of supply voltage difference value Δ(t). In embodiments, mapping coefficients Ck(t) vary at approximately the rate of change in the external impedance environment of antenna 114. In embodiments, mapping coefficients Ck(t) vary according to changes in the ratio of out-of-band power and in-band power at antenna 114.

In embodiments, reflected signal feedback control 130 may detect a signal Preflected(t) internally reflected by antenna 114. Due to any degree of impedance mismatching between power amplifier 110 and antenna 114, some of the signal S(t) amplified by power amplifier 110 may be reflected back from antenna 114. Although variable impedance device 112 may be tuned to have optimized impedance characteristics to minimize impedance mismatches between power amplifier 110 and antenna 114, there may always be some level of impedance mismatching and corresponding signal Preflected(t) reflected from antenna 114 back to power amplifier 110 through variable impedance device 112. Reflected signal feedback control 130 may generate control signals Vcontrol(t) based on reflections from antenna 114 and independent from the generation of mapping coefficients Ck(t). Control signals Vcontrol(t) from reflected signal feedback control 130 may be combined with control signals ΔVcontrol(t) output from control signal generator 118. In embodiments, reflected signal feedback control 130 may be optional and control signals ΔVcontrol(t) output from control signal generator 118 may control variable impedance device 112 without any control feedback based on signal reflections Preflected(t) from antenna 114. In embodiments, control signals ΔVcontrol(t) output from control signal generator 118 may supplement control signals Vcontrol(t) from reflected signal feedback control 130 to control variable impedance device 112.

Output impedance ZPA(t) of power amplifier 110 based on variance of VDS(t) may be nonlinear. The relationship between the impedance characteristics of variable impedance device 112 and control signals ΔVcontrol(t) may also be nonlinear. Mapping by polynomial weighting mapping 128 to generate control signals ΔVcontrol(t) may also therefore be nonlinear. Nonlinear functions may be characterized by a basis set of independent polynomials. In embodiment, a polynomial function of VDS(t) may be represented as a linear combination of polynomials (e.g. orthogonal polynomials) of the same degree. In embodiments, the optimal mapping from VDS(t) into ΔVcontrol(t) may be a linear combination of orthogonal polynomials in VDS(t) with optimal weighting coefficients that are adaptive to environmental changes in the impedance ZANT(t) of antenna 114. In embodiments, the polynomials need not be orthogonal polynomials.

Optimal mapping between $V_{DS}(t)$ and ΔVcontrol(t) is may be representable as a linear sum of the components of an underlying polynomial basis, in accordance with embodiments. For any defined basis of basis polynomial generator 126, the optimal mapping coefficients Ck(t) will be different. Embodiments relate to determining mapping coefficients Ck(t) for any defined basis of basis polynomial generator 126.

The most rapid convergence of any coefficient estimation method may be achieved when the individual components of the basis are orthogonal, in accordance with embodiments. In embodiments, non-orthogonal polynomials may be used since more simple polynomial functions can conserve computational resources of a system.

Figure 10:
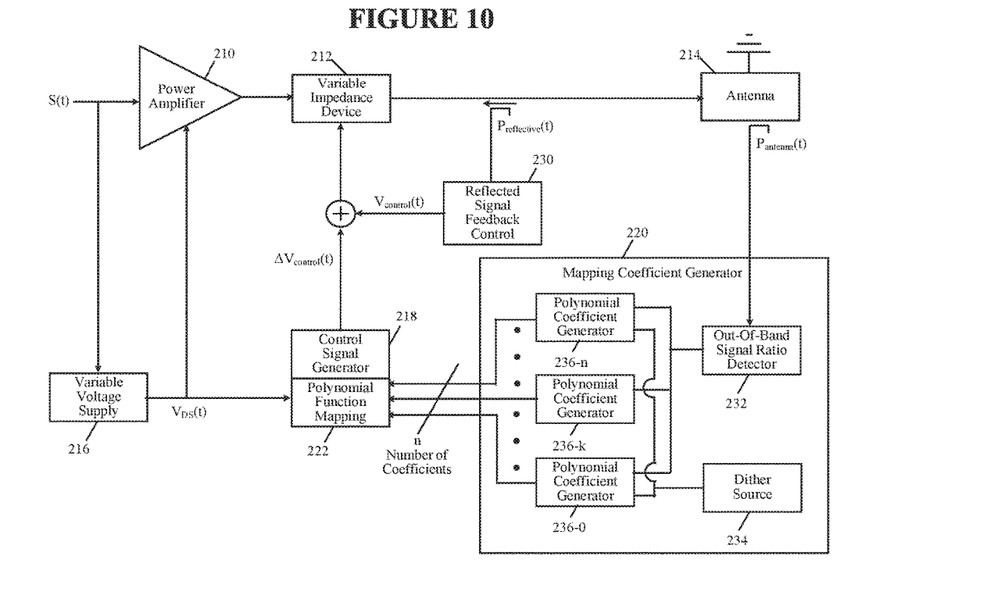
FIG. 10 illustrates use of a dither source to dynamically vary mapping coefficients, in accordance with embodiments.

Example FIG. 10 illustrates use of dither source 234 to dynamically vary the mapping coefficients, in accordance with embodiments. A transmission signal S(t) may be amplified by power amplifier 210 prior to being propagated from antenna 214. Variable impedance device 212 may be dynamically controlled to have optimal impedance characteristics to match the quickly varying impedance of power amplifier 210 and the slower varying impedance of antenna 14. Power Preflective(t) reflected from antenna 214 due to impedance mismatches may be processed by reflected signal feedback control 230 to produce control signal Vcontrol(t), in accordance with embodiments. Control signal ΔVcontrol(t) from control signal generator 218 may supplement control signal Vcontrol(t) to control variable impedance device 212, in accordance with embodiments. In embodiments, reflected signal feedback control 230 may not be included and control signal ΔVcontrol(t) from control signal generator 218 may control variable impedance device 212 without considering the amplified signal reflected by antenna 214.

Variable voltage supply 216 may supply a variable supply voltage VDS(t) to power amplifier 210 and polynomial function mapping 222. Polynomial function mapping 222 may be part of control signal generator 218, in accordance with embodiments. Polynomial function mapping 222 may receive n coefficients from mapping coefficient generator. The number of coefficients (n) may correspond to the order of the polynomial of polynomial function mapping 222. For example, if the underlying basis of polynomial function mapping is a third order polynomial, then mapping coefficient generator 220 would dynamically output four mapping coefficients to polynomial function mapping 222. Each of the output mapping coefficients may be generated by a polynomial coefficient generator (e.g. 236-0, 236-k, 236-n and any intermediary coefficients). For example, a zero-order polynomial coefficient generator 236-0 may receive feedback from both out-of-band signal ratio detector 232 and dither source 234, in accordance with embodiments.

Out-of-band signal ratio detector 232 may receive a measurement of the signal output from antenna 214 and compare the ratio of out-of-band power to in-band power, in accordance with embodiments. In embodiments, an indication of the ratio of out-of-band power to in-band power may be output to each polynomial coefficient generator (e.g. 236-0, 236-k, 236-n and any intermediary coefficients). Each polynomial coefficient generator 236 may also receive an output of dither source 234, in accordance with embodiments. In embodiments, the dither source 234 allows for the polynomial coefficient generator 236 to generate mapping coefficients that allow for optimal mapping of the variable voltage supply signal VDS(t) into control signals ΔVcontrol(t).

Although embodiments and their advantages have been described in detail, it should be understood that various changes, substitutions and alterations can be made herein without departing from the spirit and scope of the disclosed as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a power amplifier;
   at least one variable impedance device electrically coupled to an output of the power amplifier;
   at least one antenna electrically coupled to an output of the variable impedance device,
   wherein optimized impedance characteristics of the at least one variable impedance device is varied based on variation of a supply voltage to the power amplifier and variation of impedance characteristics of the antenna.

2. The apparatus of claim 1, wherein the optimized impedance characteristics of the at least one variable impedance device causes the apparatus to transmit wireless signals with minimal out-of-band transmission at an optimized efficiency of the power amplifier.

3. The apparatus of claim 1, wherein:
   the variation of impedance characteristics of the at least one antenna cause a change in coefficients of a mapping function; and
   an output of the mapping function comprises at least one control signal that controls the optimized impedance characteristics of the at least one variable impedance device as a function of the variation of the supply voltage to the power amplifier.

4. The apparatus of claim 3, wherein the coefficients of the mapping function are determined based on a comparison of out-of-band power and in-band power transmitted by the at least one antenna.

5. The apparatus of claim 4, wherein:
   the apparatus is configured to transmit through the at least one antenna a wireless signal within a predetermined frequency spectrum;
   the in-band power transmitted by the at least one antenna represents transmission power of the wireless signal within the predetermined frequency spectrum; and
   the out-of-band power transmitted by the at least one antenna represents transmission power of the wireless signal outside of the predetermined frequency spectrum.

6. The apparatus of claim 4, wherein the comparison of the out-of-band power and the in-band power transmitted by the at least one antenna represents impedance matching characteristics between the at least one antenna with the at least one variable impedance device and/or the power amplifier.

7. The apparatus of claim 6, wherein the variation of impedance characteristics of the at least one antenna is determined by measurement of out-of-band power compared with the in-band power transmitted by the at least one antenna.

8. The apparatus of claim 3, wherein the mapping function is represented by a polynomial sequence with the coefficients of the mapping function representing the weighting of the polynomial elements.

9. The apparatus of claim 8, wherein the polynomial sequence is a linear combination of orthogonal polynomials.

10. The apparatus of claim 9, wherein the orthogonal polynomials are Hermite polynomials.

11. The apparatus of claim 3, wherein a variable of the mapping function is the difference between an instantaneous value of the supply voltage of the power amplifier and a long-term average of the supply voltage of the power amplifier.

12. The apparatus of claim 3, wherein the coefficient of the mapping function are determined by adaptive loops that vary the coefficients of the mapping function.

13. The apparatus of claim 12, wherein the adaptive loops apply an orthogonal dither to dynamically determine the coefficients of the mapping function.

14. The apparatus of claim 1, wherein the at least one variable impedance device dynamically varies input impedance as seen by the power amplifier.

15. The apparatus of claim 1, wherein the at least one variable impedance device dynamically varies output impedance as seen by the at least one antenna.

16. The apparatus of claim 1, wherein:
the at least one variable impedance device dynamically varies input impedance as seen by the power amplifier;
the at least one variable impedance device dynamically varies output impedance as seen by the at least one antenna; and
the combination of the input impedance as seen by the power amplifier and the output impedance as seen by the at least one antenna are the optimized impedance characteristics of the at least one variable impedance device.

17. The apparatus of claim 1, wherein the apparatus is at least one of a mobile device, cellular telephone, smart phones, tablet, laptop computer or other battery operated apparatus.

18. The apparatus of claim 1, wherein the apparatus is a stationary device that operates without a battery power source.

19. A method comprising:
optimizing efficiency of a power amplifier by varying impedance characteristics of at least one variable impedance device based on variation of a supply voltage to the power amplifier and variation of impedance characteristics of an antenna, wherein:
the at least one variable impedance device is electrically coupled to an output of the power amplifier;
the at least one antenna is electrically coupled to an output of the variable impedance device.

20. The method of claim 19, wherein the optimized impedance characteristics of the at least one variable impedance device causes transmission of wireless signals with minimal out-of-band transmission at an optimized efficiency of the power amplifier.

21. The method of claim 19, wherein:
the variation of impedance characteristics of the at least one antenna cause a change in coefficients of a mapping function; and
an output of the mapping function comprises at least one control signal that controls the optimized impedance characteristics of the at least one variable impedance device as a function of the variation of the supply voltage to the power amplifier.

22. The method of claim 21, wherein the coefficients of the mapping function are determined based on a comparison of out-of-band power and in-band power transmitted by the at least one antenna.

23. The method of claim 22, comprising transmitting through the at least one antenna a wireless signal within a predetermined frequency spectrum, wherein:
the in-band power transmitted by the at least one antenna represents transmission power of the wireless signal within the predetermined frequency spectrum; and
the out-of-band power transmitted by the at least one antenna represents transmission power of the wireless signal outside of the predetermined frequency spectrum.

24. The method of claim 22, wherein the comparison of the out-of-band power and the in-band power transmitted by the at least one antenna represents impedance matching characteristics between the at least one antenna with the at least one variable impedance device and/or the power amplifier.

25. The method of claim 24, wherein the variation of impedance characteristics of the at least one antenna is determined by measurement of out-of-band power compared with the in-band power transmitted by the at least one antenna.

26. The method of claim 21, wherein the mapping function is represented by a polynomial sequence with the coefficients of the mapping function representing the weighting of the polynomial elements.

27. The method of claim 26, wherein the polynomial sequence is a linear combination of orthogonal polynomials.

28. The method of claim 27, wherein the orthogonal polynomials are Hermite polynomials.

29. The method of claim 21, wherein a variable of the mapping function is the difference between an instantaneous value of the supply voltage of the power amplifier and a long-term average of the supply voltage of the power amplifier.

30. The method of claim 21, wherein the coefficient of the mapping function are determined by adaptive loops that vary the coefficients of the mapping function.

31. The method of claim 30, wherein the adaptive loops apply an orthogonal dither to dynamically determine the coefficients of the mapping function.

32. The method of claim 19, wherein the at least one variable impedance device dynamically varies input impedance as seen by the power amplifier.

33. The method of claim 19, wherein the at least one variable impedance device dynamically varies output impedance as seen by the at least one antenna.

34. The method of claim 19, wherein:
the at least one variable impedance device dynamically varies input impedance as seen by the power amplifier;
the at least one variable impedance device dynamically varies output impedance as seen by the at least one antenna; and
the combination of the input impedance as seen by the power amplifier and the output impedance as seen by the at least one antenna are the optimized impedance characteristics of the at least one variable impedance device.

35. The method of claim 19, wherein the method is implemented in at least one of a mobile device, cellular telephone, smart phones, tablet, laptop computer, battery operated, or a stationary device that operates without a battery power source.

\* \* \* \* \*

UNITED STATES PATENT AND TRADEMARK OFFICE
CERTIFICATE OF CORRECTION

PATENT NO. : 9,979,359 B2
APPLICATION NO. : 15/642647
DATED : May 22, 2018
INVENTOR(S) : Ronald Duane McCallister

Page 1 of 1

It is certified that error appears in the above-identified patent and that said Letters Patent is hereby corrected as shown below:

On the Title Page

The title should be amended to read MINIMIZING IMPEDANCE MISMATCH EFFECTS IN A WIRELESS DEVICE.

Signed and Sealed this
Twenty-third Day of October, 2018

Andrei Iancu
*Director of the United States Patent and Trademark Office*